(12) United States Patent
Schultheis et al.

(10) Patent No.: US 7,431,808 B2
(45) Date of Patent: Oct. 7, 2008

(54) SPUTTER TARGET BASED ON TITANIUM DIOXIDE

(75) Inventors: Markus Schultheis, Fulda (DE); Christoph Simons, Biebergemünd (DE); Martin Weigert, Hanau (DE)

(73) Assignee: W.C. Heraeus GmbH & Co., KG, Hanau (DE)

( * ) Notice: Subject to any disclaimer, the term of this patent is extended or adjusted under 35 U.S.C. 154(b) by 189 days.

(21) Appl. No.: 10/223,531

(22) Filed: Aug. 19, 2002

(65) Prior Publication Data

US 2003/0038028 A1 Feb. 27, 2003

(30) Foreign Application Priority Data

Aug. 17, 2001 (DE) ................. 101 40 514

(51) Int. Cl.
*C23C 14/35* (2006.01)
*B28B 1/00* (2006.01)
*B22F 1/00* (2006.01)
*C04B 35/00* (2006.01)

(52) U.S. Cl. ............. 204/192.26; 204/192.22; 204/192.27; 204/192.28; 204/298.13; 204/298.12; 501/134; 419/30; 419/38; 419/39; 264/667; 264/681

(58) Field of Classification Search ......... 204/298.12, 204/298.13, 192.15, 192.22, 192.26, 192.27, 204/192.28, 192.12; 501/134; 419/30, 38, 419/39; 264/603, 667, 681
See application file for complete search history.

(56) References Cited

U.S. PATENT DOCUMENTS

| | | | | |
|---|---|---|---|---|
| 4,497,700 | A * | 2/1985 | Groth et al. | 204/192.27 |
| 5,110,662 | A * | 5/1992 | Depauw et al. | 428/192 |
| 5,279,722 | A | 1/1994 | Szczyrbowski et al. | 204/192.27 |
| 5,403,458 | A * | 4/1995 | Hartig et al. | 204/192.15 |
| 5,962,115 | A | 10/1999 | Zmelty et al. | 428/216 |
| 6,018,169 | A | 1/2000 | Tohyama | |
| 6,193,856 | B1 | 2/2001 | Kida et al. | 204/192.22 |
| 6,387,446 | B1 | 5/2002 | Lobmann et al. | 427/372.2 |
| 6,761,984 | B2 * | 7/2004 | Anzaki et al. | 428/697 |
| 2001/0006148 | A1 | 7/2001 | Szczyrbowski et al. | |

FOREIGN PATENT DOCUMENTS

| | | |
|---|---|---|
| DE | 38 02 852 | 8/1989 |
| DE | 41 35 701 | 5/1993 |
| DE | 42 11 363 | 10/1993 |
| DE | 195 20 843 | 12/1996 |
| DE | 196 44 752 | 4/1998 |
| DE | 198 45 291 | 4/2000 |
| DE | 198 58 227 | 6/2000 |
| DE | 199 22 162 | 11/2000 |
| DE | 199 58 424 | 5/2002 |
| EP | 1 068 899 | 1/2001 |
| JP | 41 41 577 | 5/1992 |
| JP | 63 05 888 | 11/1994 |
| JP | 07-233469 * | 5/1995 |
| JP | 72 33 469 | 9/1995 |
| WO | WO 97/25450 | 7/1997 |
| WO | WO 97/25451 | 7/1997 |
| WO | WO 01/46488 * | 6/2001 |

OTHER PUBLICATIONS

Stein, The Random House College Dictionary, 1982, p. 1379.*
Machine Translation of JP 07-233469.*
Article entitled "Temperable Low Emissivity Coating Based on Twin Magnetron Sputtered $TiO_2$ and $Si_3N_4$ Layers" by Szczyrbowski, et al. appearing in 1999 Society of Vacuum Coaters, pp. 141-146.

* cited by examiner

*Primary Examiner*—Rodney G McDonald
(74) *Attorney, Agent, or Firm*—Klaus P. Stoffel; Wolff & Samson PC

(57) ABSTRACT

An electrically conductive titanium dioxide sputter target with an electrical resistivity of less than 5 Ω-cm, which contains as an additive at least one doping agent or a mixture of doping agents in an amount of less than 5 mole %. The doping agent or agents are selected from the group including indium oxide, zinc oxide, bismuth oxide, aluminum oxide, gallium oxide, antimony oxide, and zirconium oxide. This treatment renders the titanium dioxide sputter target suitable for use in a direct-current sputtering process without any negative effects on the properties of the coating.

7 Claims, No Drawings

SPUTTER TARGET BASED ON TITANIUM DIOXIDE

BACKGROUND OF THE INVENTION

The invention relates to a sputter target composed of titanium dioxide for producing optically active functional coatings made of titanium dioxide. Coatings of this type are used, for example, in combination with coatings composed of other materials, for large-area glass coating in the production of architectural glass.

Coating systems that reflect thermal radiation, which consist, for example, of a coating of silver as a functional coating and at least one other coating composed of a metal oxide as a dielectric antireflection coating, are described, for example, in DE 41 35 701 A1. The metal oxide coating, which is placed above the silver coating, has the additional purpose, for example, of preventing long-term damage to the silver coating by oxidation. One of the requirements placed on the metal oxide coating is that it must not too strongly reduce the transmission of the total coating system in the visible wavelength range of light (e.g., in the case of automotive windshields), a transmission factor of at least 75% is required (DE 198 58 227 C1).

The basic requirement for coating systems of this type is thus the highest possible transmission in the spectral range of solar radiation, i.e., in the wavelength range of 300-2,500 nm, and especially in the range of visible light of 380-780 nm, while in the range of thermal radiation, i.e., the wavelength range of 4,000-50,000 nm, an emissivity value as low as possible is required (DE 199 22 162 A1). Coating systems of this type are described in the literature as "low-e coatings" (low heat emissivity), e.g., Szczyrbowski et al., 1999, Society of Vacuum Coaters 505/856-7188, $42^{nd}$ Annual Technical Conference Proceedings (1999), pp. 141-146. In practice, dielectric coatings are applied as topcoats or undercoats over or under the silver coatings. Various metal oxides and multiple combinations may be used for this purpose.

The homogeneity and long-term stability requirements of the coatings produced in this way are becoming increasingly stringent due to the increasing use of ever-larger substrates (e.g., glass plates with dimensions of 3.21 m by 6.00 m are customary, DE 199 22 162 A1), and the chemical engineering process parameters must be stably controlled.

It should be pointed out in passing, for example, that with many metal oxide coatings that have the required property of being highly refractive and that are suitable for the applications described above, the metal oxides may occur in several modifications. However, in the production of these coating systems, the requirement of reproducibility of the index of refraction of the highly refractive coating absolutely must be satisfied. In the specific application referred to here, it is necessary to guarantee an index of refraction of greater than 2.3, since otherwise the desired optical function of the titanium dioxide coating is not obtained. For the example of titanium dioxide, which can occur in rutile, anatase, and brookite modifications, all of which have different mechanical and optical properties, this means that, depending of the crystal lattice structure, i.e., depending on the titanium dioxide modification, the index of refraction can vary from 1.9 to 2.6. Minor instabilities in the way the process is carried out can thus have a significant effect on the index of refraction of the coating.

The literature describes a large number of different processes for producing titanium dioxide coatings on various substrates, e.g., sputtering, vaporization, chemical vapor deposition, and metal-organic decomposition. DE 198 45 291 A1 describes, for example, a wet-chemical process via a sol-gel process, in which a soluble powder that contains titanium is first produced, which is applied to a substrate by a chemical process, and then the coating is produced by a subsequent tempering process.

In contrast to this process, in PVD (physical vapor deposition) processes, the coatings are produced on the surface of a substrate by converting the coating material to the gas phase. In these processes, the coating is usually produced with a metal or metal compound. The advantage of PVD processes lies in the fact that almost all metals, metal alloys and metallic compounds can be deposited on virtually all materials (the substrate), i.e., suitable substrates include, for example, glass, plastics, ceramics, metals, and metal alloys.

PVD processes include sputtering or cathode sputtering, in which the sputter gas (e.g., argon) is ionized to form a plasma, and, in a gas atmosphere, the noble gas ions formed in this way are directed at a material source (the target). The energy of the ions is so great that atoms of the target material are dislodged and become the coating material. The vaporized components of the target form the desired coating on the surface of the workpiece to be coated. The process parameters during the sputtering process are selected in such a way as to systematically control the properties of the coatings, such as hardness, microstructure, adhesion, electrical conductivity, optical properties, and chemical and thermal stability.

Electrically conducting materials can be sputtered with a direct-current source, whereas in the sputtering of dielectric materials, it is necessary, for example, to ignite a high-frequency plasma in front of the target, so that the voltage does not drop over the insulating target.

Compared to conventional vaporization, sputtering, i.e., cathode sputtering, has the advantage that there are significantly more combinations in the selection of the material to be coated and the material to be "vaporized". It is not an insignificant advantage that, for example, the possibility of including reactions with the plasma in the so-called "vapor chamber" can be incorporated in the entire engineering process, i.e., "reactive sputtering" is used, from which other variation possibilities may then be developed.

Consistent with the desired process parameters with respect to the gas-discharge characteristics, primarily inert gases are used, especially argon or helium. Furthermore, reactive gases may also be used for reactive gas sputtering, such as oxygen, acetylene, or nitrogen. In both inert gas sputtering and reactive gas sputtering, the sputter target constitutes tie reservoir of material to be consumed. In the case of inert gas sputtering, the coating formed on the substrate is deposited exclusively from the sputter target, while in reactive gas sputtering, the coating formed on the substrate is a reaction product between the target material and the reaction gas. These then are the basic prior-art possibilities, which can be used to produce thin coatings of dielectric materials (i.e., in the case of the present invention, metal oxides, such as titanium dioxide) by sputtering. Either a target made of titanium is used, whose metallic component reacts with oxygen in the plasma to produce a titanium dioxide coating on the substrate, or a target that already consists of titanium dioxide is used, so that the titanium dioxide is vaporized and deposited as a coating on the substrate.

DE 42 11 363 A1 and DE 195 20 843 A1 describe, for example, processes such as these for producing coatings with high transmission in the visible spectral range and high reflection in the thermal radiation range with the use of reactive sputtering, and they describe the coating combinations produced by these processes with a titanium dioxide coating integrated in the coating system. In the well-known reactive sputtering processes, the target is the cathode. Alternatively, so-called double electrodes are also used, which alternate between acting as the anode and the cathode. Electric power is supplied to the electrodes either as direct current or alternating current, as is described, for example, in DE 38 02 852 A1.

If dielectric coatings, e.g., $SiO_2$, $Al_2O_3$, $ZrO_2$, $TiO_2$, and ZnO, are to be deposited, the target to be sputtered then consists of the corresponding metal that is present as an element in the specified compounds, and a plasma cloud, which consists, for example, of an ionized $Ar/O_2$ or $Ar/N_2$ mixture, strikes the metal of which the target is composed and causes it to sputter. The metal oxides (or nitrides) formed in this way are then deposited on the surface of the substrate.

It is known from DE 196 44 752 A1 that stable sputtering conditions for producing high-grade metal oxide coatings of high optical quality in a reproducible and industrially cost-effective way can be adjusted only with the aid of expensive process control equipment. The problem associated with the stable production of dielectric titanium dioxide coatings of this type in the reactive sputtering mode by the DC sputtering process used in the cited patent is based on the fact that the cathode characteristic curve of the DC-supplied, high-power cathode, in which the titanium target is integrated, has a hysteresis loop. Depending on the oxygen supply in the plasma reaction chamber, this can cause the sputter operating point to jump uncontrollably from the metallic sputtering state to the oxidic sputtering state.

The sputtering rate itself is increased by the use of at least two adjacent electrodes arranged together in the plasma chamber, which is important especially in the case of substrates that are to be coated in continuous operations. Further details on sputtering rates and coating growth rates compared to conventional DC sputtering and the use of a "TWIN-MAG" may be found in the publication cited earlier (Szczyrbowski et al., 1999, Society of Vacuum Coaters 505/856-7188, $42^{nd}$ Annual Technical Conference Proceedings (1999), pp. 141-146).

It is also well known, e.g., from U.S. Pat. No. 6,193,856 (WO 97/08,359), that the rate of coating growth in reactive sputtering is very low, which is a disadvantage, particularly when substrates with large surface areas are being coated, and results in low productivity and high costs. A well-known possibility for avoiding these problems is specified in above-cited U.S. Pat. No. 6,193,856, in which the reactive partial process is omitted, the dielectric metal oxide is used as the sputter target, and then, for example, a metal oxide film composed of titanium dioxide is deposited on the substrate. A disadvantage of these processes is that these metal oxides generally have no electrical conductivity or only extremely low electrical conductivity and are therefore inherently unsuitable for the direct-current sputtering process.

According to our own results, the "critical" value for the electrical resistivity of a sputter target composed of a suitable metal oxide for a direct-current sputtering process, preferably titanium dioxide, is about 1 $\Omega$-cm. It must be clearly stated that this is not a precise mathematical value, but rather is intended only to indicate the order of magnitude. This "critical" value depends strongly on the system parameters and is variously specified in the patent literature. For example, in WO 97/25,450, the value of 1 $\Omega$-cm is confirmed, but a preferred value of 0.1 $\Omega$-cm is also specified. In WO 97/25,451, a value of 10 $\Omega$-cm is identified as being clearly too high for a direct-current sputtering process, a value of 0.5 $\Omega$-cm is recommended, and 0.02 $\Omega$-cm is given as the best value.

In this connection, a substoichiometric $TiO_x$ with x in the range of 1.55 to 1.95 is generally used, e.g., in accordance with WO 97/25,450 and WO 97/25,451. To produce multiple coating systems with specific photocatalytic properties, EP 1,068,899 A1 describes the addition of oxides of metals from the group comprising niobium, tantalum, vanadium, zirconium, tin, zinc, chromium, ad copper in an amount of about 1-10 wt. % to the principal component, titanium dioxide. The desired active coatings are produced in this way on, for example, glass substrates. To produce coatings from a mixture of titanium dioxide and the other oxides specified above, one uses an electrically conductive sintered target composed of this mixture.

Examples of processes for producing a titanium dioxide sputter target of this type with a substoichiometric oxygen content for use in a direct-current sputtering process include hot pressing in a nonoxidizing atmosphere, as described in JP-A 07[1995]-233,469, or a reducing plasma spray process, as described in WO 97/08,359. However, these two processes are very cost-intensive.

In regard to the use of titanium dioxide targets for direct-current sputtering, the patent literature, e.g., WO 97/25,450, gives a possible improvement in the sputtering rate by a factor of 10 compared to conventional reactive sputtering with a pure titanium target and oxygen supplied in the plasma.

However, titanium dioxide targets of this type are generally economically infeasible due to their high production costs.

SUMMARY AND DESCRIPTION OF THE INVENTION

Therefore, the object of the present invention is to produce a titanium dioxide sputter target in such a way that it is suitable for direct-current sputtering, i.e., the electrical resistivity should be less than 5 $\Omega$-cm (but preferably even less than 1 $\Omega$-cm). To this end, doping agents are added in small amounts to increase the electrical conductivity of the sputter target. However, the doping agents must not have any negative effects on the properties of the coating. It must be guaranteed that the index of refraction of the coating deposited on the substrate is greater than 2.3, and, in addition, the doping agents must not cause increased absorption. Finally, it must be possible to produce the sputter targets in large numbers by a process that is very cost-effective and easy to control from the chemical engineering standpoint.

In accordance with the invention, these goals are achieved by adding doping agents to the basic titanium dioxide target material and then processing this mixture by a simple ceramic processing technique, e.g., cold pressing and sintering. The doping agent or mixture of doping agents is selected from the group of oxides comprising indium oxide ($In_2O_3$), zinc oxide (ZnO), bismuth oxide ($Bi_2O_3$), aluminum oxide ($Al_2O_3$), gallium oxide ($Ga_2O_3$), antimony oxide ($Sb_2O_3$), and zirconium oxide ($ZrO_2$) and is added to the titanium dioxide in amounts of less than 5 mole %. It was found to be especially advantageous to limit the relative amount of doping agent to the range of 0.05 mole % to 1.0 mole %. Especially good results are obtained when indium oxide ($In_2O_3$) is selected as the doping agent.

The individual components of the mixture of titanium dioxide powder and the powder of the selected doping agent are mixed, for example, in an asymmetric moved mixer or in a rotating mixing vessel with a contrarotating stirrer. A pressing mold is then filled with the mixture of powders, and the mixture is pressed. The pressing pressure may be about 0.5 $t/cm^2$ to 2.0 $t/cm^2$. To produce homogeneously compressed compacts, it is especially advantageous if, after the first pressing operation, a secondary compression is carried out in an isostatic pressing process with a compacting pressure in the second operation in the range of 2.0 $t/cm^2$ to 3.0 $t/cm^2$.

After the compacting process, the compacts are sintered at 1,300-1,600° C. and standard pressure. The densities produced in this way are 3.4-4.1 $g/cm^3$.

Possible embodiments are listed in the table below.

TABLE OF EMBODIMENTS WITH COMPARATIVE VALUES

| Powder Mixture | Compacting Pressure [t/cm$^2$] | Sintering Temperature [° C.] | Density [g/cm$^3$] | Electrical Resistivity [Ω-cm] | Source |
|---|---|---|---|---|---|
| 0.5 mol % ZrO$_2$, Remainder TiO$_2$ | 0.7 | 1400 | 3.48 | 0.4 | Our Own Test |
| 1.0 mol % ZrO$_2$, Remainder TiO$_2$ | 1.5 | 1450 | 3.80 | 0.15 | Our Own Test |
| 0.05 mol % In$_2$O$_3$, Remainder TiO$_2$ | 1.5 | 1450 | 4.01 | 0.09 | Our Own Test |
| 0.25 mol % In$_2$O$_3$, Remainder TiO$_2$ | 1.5 | 1450 | 3.90 | 0.04 | Our Own Text |
| 0.5 mol % In$_2$O$_3$, Remainder TiO$_2$ | 1.5 | 1450 | 3.79 | 0.06 | Our Own Test |
| 0.5 mol % Al$_2$O$_3$, Remainder TiO$_2$ | 1.5 | 1450 | 3.85 | 0.21 | Our Own Test |
| 0.5 mol % Bi$_2$O$_2$, Remainder TiO$_2$ | 1.8 | 1500 | 3.86 | 0.82 | Our Own Test |
| 0.5 mol % Al$_2$O$_3$ + 0.05 mol % In$_2$O$_3$ + 0.05 mol % ZrO$_2$, Remainder TiO$_2$ | 1.5 | 1500 | 3.92 | 0.19 | Our Own Test |
| 0.05 mol % ZnO + 0.05 mol % Al$_2$O$_3$, Remainder TiO$_2$ | 1.5 | 1450 | 3.78 | 0.18 | Our Own Test |
| Comparative Value | | | | | |
| TiO$_2$ | 1.0 | 1400 | 3.85 | 1000 | Our Own Test |
| TiO$_2$ | | Hot-pressed at 1,100-1,400° C. | 3.90-4.17 | 0.12-0.35 | Our Own Test |
| TiO$_2$ | | Plasma-sprayed | | 0.02-0.5 | |

We claim:

1. An electrically conducting sputter target comprising: titanium dioxide (TiO$_2$) with an electrical resistivity of less than 5 Ω-cm; and a doping agent added to the TiO$_2$ in an amount of less than 5 mole %, the doping agent being gallium oxide (Ga$_2$O$_3$), whereby the sputter target has a density of 3.4-4.1 g/cm$^3$ and can produce coatings having an index of refraction of greater than 2.3.

2. A sputter target in accordance with claim 1, wherein the doping agent is present in an amount of 0.05 to 1.0 mole %.

3. A method for producing a titanium dioxide coating on a substrate so that the coating has an index of refraction greater than 2.3, comprising the steps of: providing an electrically conducting sputter target including titanium dioxide (TiO$_2$) with an electrical resistivity of less than 5 Ω-cm, and a doping agent added to the TiO$_2$ in an amount of less than 5 mole %, the doping agent being gallium oxide (Ga$_2$O$_3$); and coating the substrate by direct-current sputtering, the target having a density of 3.4-4.1 g/cm$^3$.

4. A method as defined in claim 3, wherein the coating step includes sputtering with planar magnetron cathodes.

5. A method as defined in claim 3, wherein the coating step includes sputtering with tubular magnetron cathodes.

6. A process for producing a sputter target, the process comprising the steps of: mixing titanium dioxide having an electrical resistivity of less than 5 Ω-cm with gallium oxide (Ga$_2$O$_3$) as a doping agent; cold pressuring the mixture; and sintering the cold-pressed mixture whereby the sputter target has a density of 3.4-4.1 g/cm$^3$.

7. A method for using an electrically conducting sputter target comprising titanium dioxide (TiO$_2$) with an electrical resistivity of less than 5 Ω-cm, and a doping agent added to the TiO$_2$ in an amount of less than 5 mole %, the doping agent being gallium oxide (Ga$_2$O$_3$), whereby the sputter target has a density of 3.4-4.1 g/cm$^3$ and can produce coatings having an index of refraction greater than 2.3, for large-area glass coating in the production of architectural glass.

* * * * *